(12) United States Patent
Huang et al.

(10) Patent No.: US 11,206,734 B1
(45) Date of Patent: Dec. 21, 2021

(54) ELECTRONIC DEVICE AND WIRING STRUCTURE THEREOF

(71) Applicants: Roger Huang, Miao-Li County (TW); Joe Huang, Chiayi County (TW); Lavender Cheng, Tainan (TW); Sean Chang, Miao-Li County (TW)

(72) Inventors: Roger Huang, Miao-Li County (TW); Joe Huang, Chiayi County (TW); Lavender Cheng, Tainan (TW); Sean Chang, Miao-Li County (TW)

( * ) Notice: Subject to any disclaimer, the term of this patent is extended or adjusted under 35 U.S.C. 154(b) by 0 days.

(21) Appl. No.: 16/896,100

(22) Filed: Jun. 8, 2020

(51) Int. Cl.
| H05K 1/02 | (2006.01) |
| H05K 1/11 | (2006.01) |
| H01L 51/00 | (2006.01) |
| H01L 23/498 | (2006.01) |
| H05K 1/18 | (2006.01) |

(52) U.S. Cl.
CPC ......... *H05K 1/028* (2013.01); *H01L 23/4985* (2013.01); *H01L 51/0097* (2013.01); *H05K 1/11* (2013.01); *H05K 1/18* (2013.01); *H05K 2201/0373* (2013.01)

(58) Field of Classification Search
CPC ............ H05K 1/028; H05K 2201/0373; H01L 23/4985; H01L 51/0097
See application file for complete search history.

(56) References Cited

U.S. PATENT DOCUMENTS

| 4,963,701 A | * | 10/1990 | Yasumoto | ............... H01L 23/15 174/256 |
| 2016/0164024 A1 | * | 6/2016 | Takamuki | ............... H01L 51/56 257/40 |
| 2016/0218305 A1 | * | 7/2016 | Kim | .................. G02F 1/133345 |
| 2019/0101785 A1 | * | 4/2019 | Araki | .................. H01L 51/5012 |
| 2019/0361286 A1 | | 11/2019 | Jang | |
| 2020/0365418 A1 | * | 11/2020 | Sawada | ................ H05K 3/4644 |

FOREIGN PATENT DOCUMENTS

JP       2004140243 A  *  5/2004

* cited by examiner

*Primary Examiner* — Ishwarbhai B Patel
(74) *Attorney, Agent, or Firm* — Patterson + Sheridan, LLP (57) ABSTRACT

A wiring structure is provided, including a conductive wiring and an insulating layer. The conductive wiring is disposed on a substrate and has a top side, a bottom side and two side walls opposite to each other. The insulating layer which wraps around the conductive wiring at least through the top side and two side walls, wherein there is a gap between the insulating layer and at least one of the two side walls.

20 Claims, 11 Drawing Sheets

ELECTRONIC DEVICE AND WIRING STRUCTURE THEREOF

BACKGROUND OF THE INVENTION

Field of the Invention

The application relates in general to an electronic device and a wiring structure thereof, and in particular to a wiring structure.

Description of the Related Art

Thanks to ongoing technological developments, recent electronic devices such as high-quality display screens usually include a plurality of LED (Light-emitting Diode) chips, which can provide 4K image quality. In the market, curved or bent screens also appear. In the manufacturing process of the display device, the metal wires will be deformed by the stress when it is bent, and the metal wires may have a risk of being cracked due to the resistance of the insulation layer when the metal wires are deformed. This improvement plan is to form a gap between the insulation layer and the side wall of the wire. Therefore, how to provide a way to avoid the wires being cracked to improve the quality of an electronic device is an important issue.

BRIEF SUMMARY OF INVENTION

To address the deficiencies of conventional products, an embodiment of the disclosure provides a wiring structure, including a conductive wiring and an insulating layer. The conductive wiring is disposed on a substrate and has a top side, a bottom side and two side walls opposite to each other. The insulating layer which wraps around the conductive wiring at least through the top side and two side walls, wherein there is a gap between the insulating layer and at least one of the two side walls.

An embodiment of the disclosure provides an electronic device, including a wiring structure including a conductive wiring and an insulating layer. The conductive wiring is disposed on a substrate and has a top side, a bottom side and two side walls opposite to each other. The insulating layer which wraps around the conductive wiring at least through the top side and two side walls, wherein there is a gap between the insulating layer and at least one of the two side walls.

BRIEF DESCRIPTION OF DRAWINGS

The disclosure can be more fully understood by reading the subsequent detailed description and examples with references made to the accompanying drawings, wherein.

DETAILED DESCRIPTION OF INVENTION

The making and using of the embodiments of the methods of manufacturing an electronic device are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

It should be noted that the electronic device may include a display device, a light emitting device, an antenna device, a sensing device, a touch electronic device (touch display), curved electronic device (curved display), non-rectangular electronic device (free shape display), or a tiled device, but is not limited thereto. The electronic device can be a foldable or flexible electronic device. The electronic device may include, for example, a light-emitting diode, fluorescence, phosphor and other suitable material, but is not limited thereto; the light-emitting diode may include, for example, an organic light-emitting diode (OLED), a sub-millimeter light-emitting diode (mini LED), and a micro light-emitting diode (micro LED) or a quantum dot (QD) light-emitting diode (which may be, for example, QLED or QDLED) or other suitable material, and the materials thereof may be arbitrarily arranged and combined, but is not limited thereto. The antenna device can be, for example, a liquid-crystal antenna, but is not limited thereto. The tiled device can be, for example, a display tiled device or an antenna tiled device, but is not limited thereto. Additionally, the shape of the electronic device can be, for example, rectangular, circular, polygonal, shape with curved edge or other suitable shapes. The electronic device may include peripheral subsystem, such as driving system, control system, light source system and frame system, etc., for supporting display device or tiled device. It should be noted that the electronic device may be combinations of the above-mentioned electronic devices, but not limited thereto. The electronic device as mentioned herein takes the display device as an example to detail the content of the present disclosure, but the present disclosure is not limited thereto.

Figure 1:
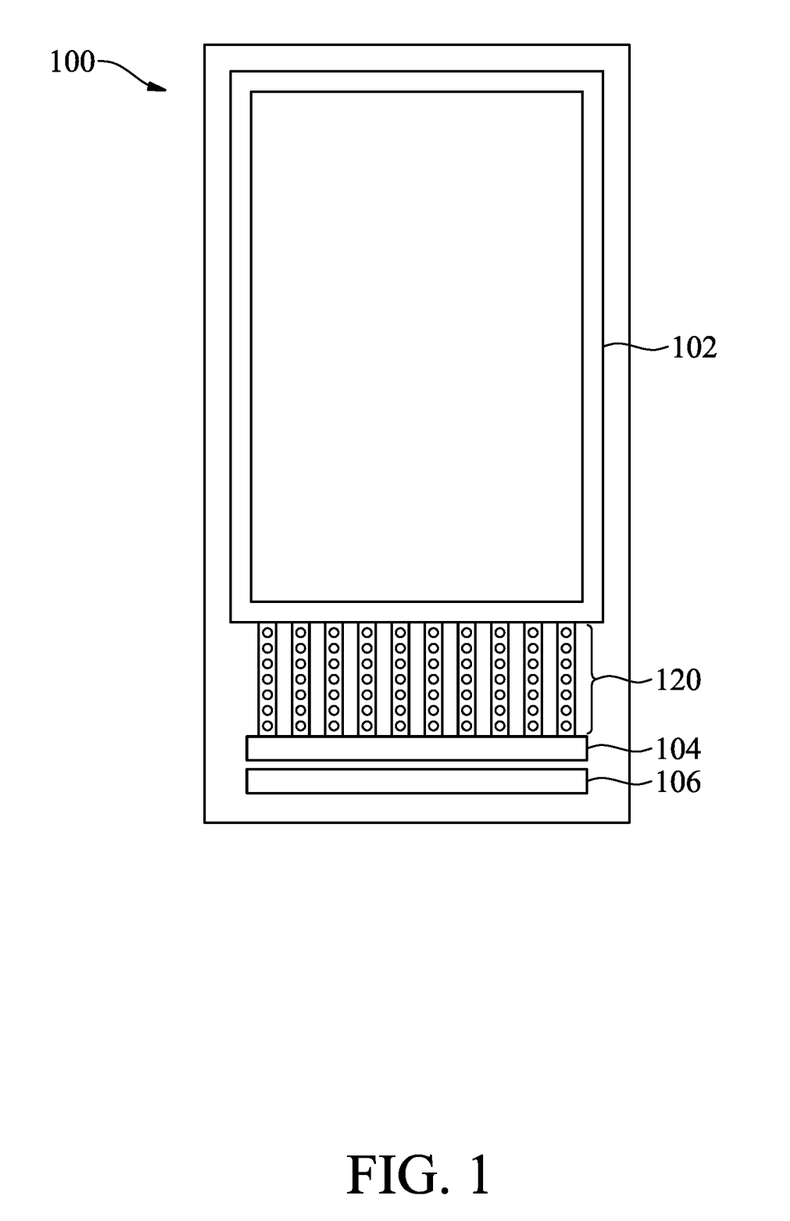
FIG. 1 is a schematic diagram of an electronic device having a wiring structure according to an embodiment of the present disclosure.

Refer to FIG. 1, which is a schematic diagram of an electronic device 100. The electronic device 100 has a display screen 102, a circuit layer 104, a bonding pad 106, and a wiring structure 120. The bonding pad 106 may be a flexible printed circuit (FPC) bonding pad, and the circuit layer 104 may be an application-specific integrated circuit (ASIC) layer which electrically connected between the display screen 120 and the bonding pad 106, but it is not limited thereto. In some embodiment, The bonding pad 106 may be a chip on film (COF) bonding pad which is electrically connected the display screen 120 through the wiring structure 120. The wiring structure 120 connects the display screen 102 to the circuit layer 104. In some embodiments, the wiring structure 120 is in a bending form. The structure of the wiring structure 120 is described in detail below.

Figure 2:
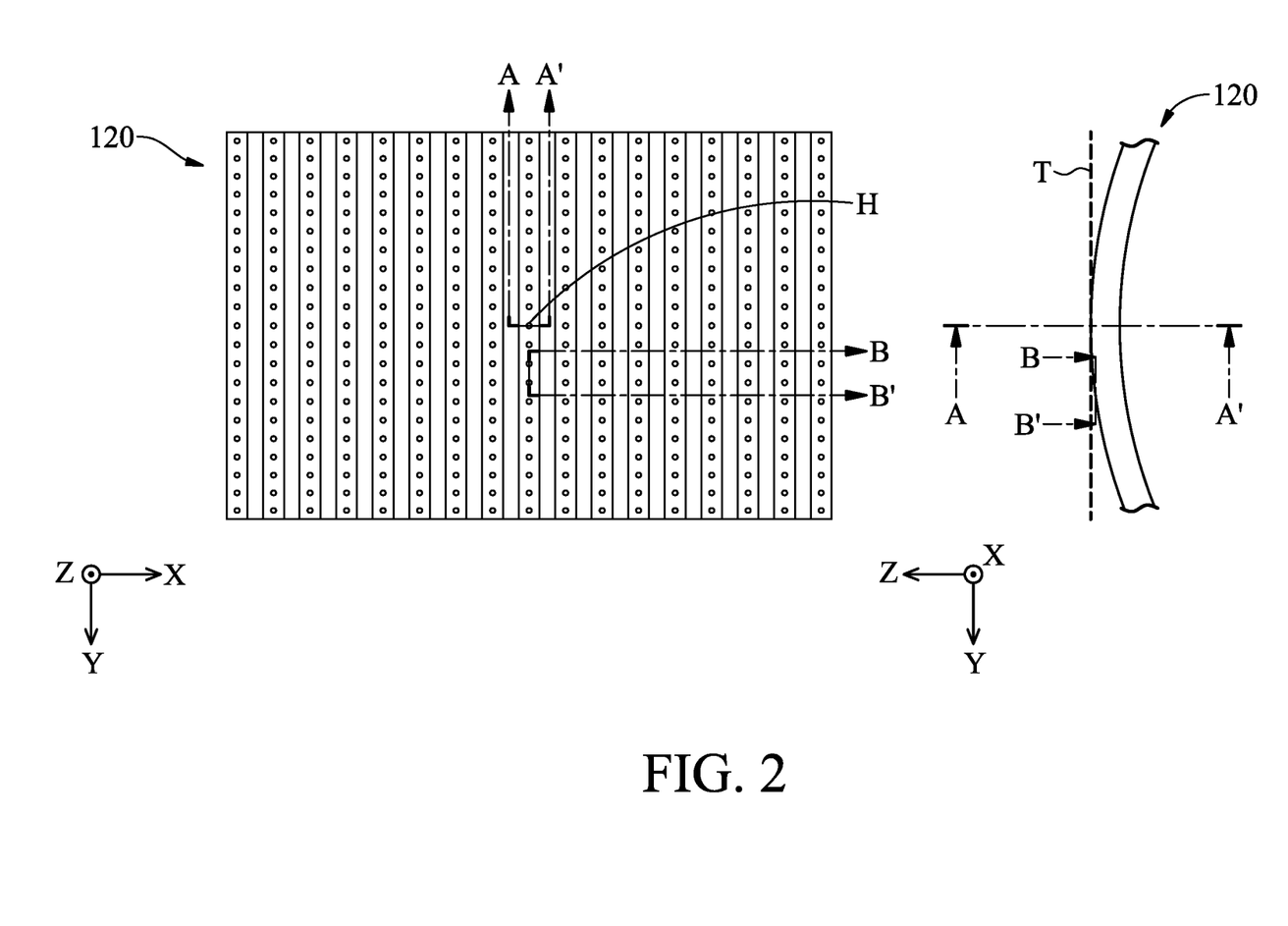
FIG. 2 is a schematic top view diagram of the wiring structure in FIG. 1.
Figure 3:
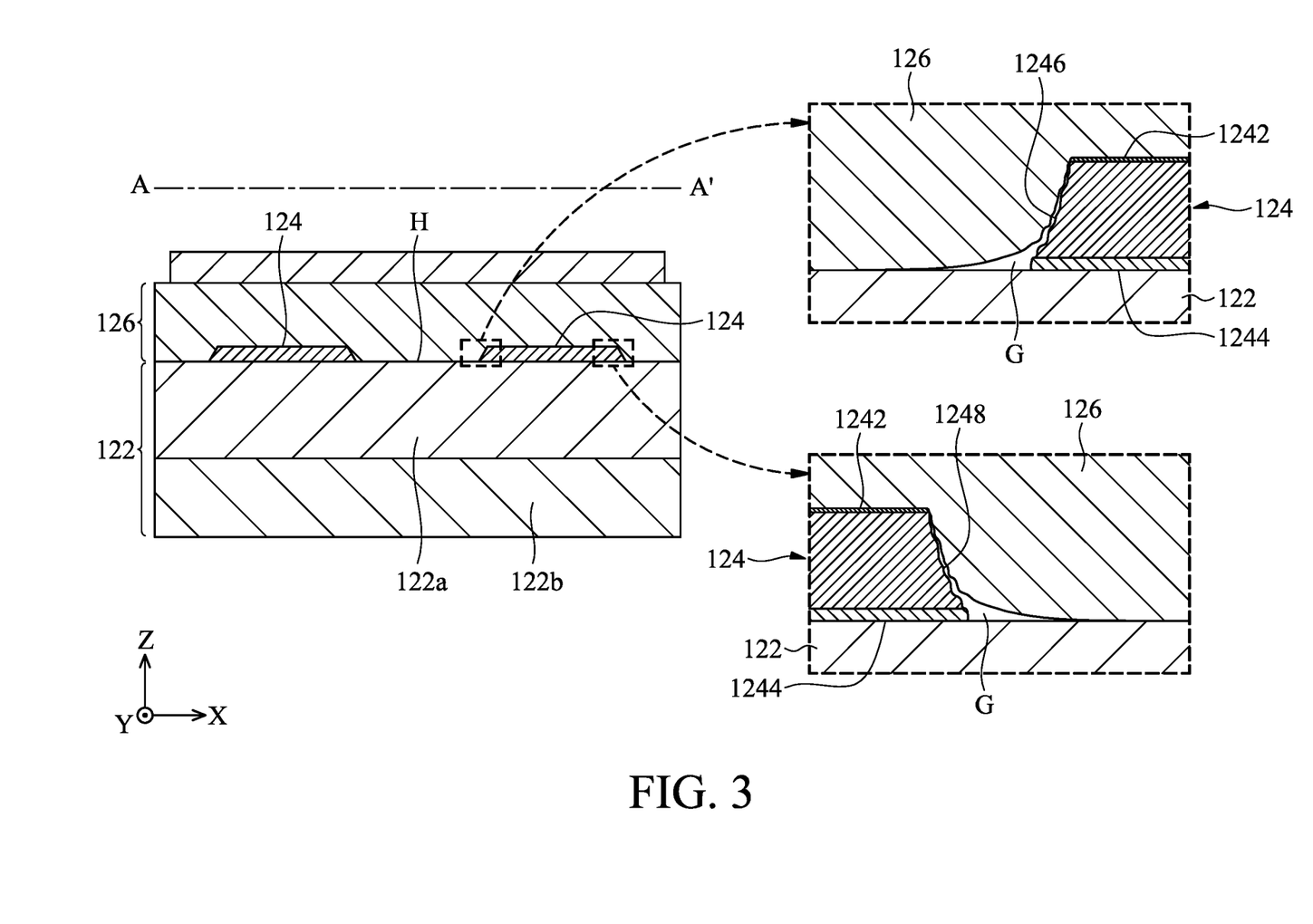
FIG. 3 is a cross-sectional view diagram along line A'-A' in FIG. 2, to show the structure of the wiring structure, with the enlarged diagrams of portions of the conducting wiring, the insulating layer and the substrate.

FIG. 2 is a top view and enlarged diagram of a portion of the wiring structure 120 having multiple holes H in a bending form, and FIG. 3 is a cross-sectional view diagram along the line A-A' in FIG. 2, to show the cross section of a portion of the wiring structure 120. The line A-A' is perpendicular to the tangent line T of the bending wiring structure 120 (or the line A-A' is along the short axis direction of a wiring in the wiring structure 120); and the line B-B' is parallel to the tangent line T (or the line B-B' is along the long axis direction of a wiring in the wiring structure 120). In some embodiments, the cross section of the wiring structure 120 taken along the line B-B' is same as taken along the line A-A'. For clarity, the following cross-sectional view diagrams are shown taken along the line A-A'.

As shown in FIGS. 2 and 3, the wiring structure 120 has a substrate 122, a conductive wiring 124, and an insulating layer 126. In some embodiments, the substrate 122 may for example include flexible substrate or non-flexible substrate in a bending form. In detail, the substrate 122 in a bending form may include the non-flexible substrate having a fixed curved shape or the flexible substrate in folding status, for example, the substrate of curvature display or foldable display. In some embodiments, the substrate 122 may include sub layer 122a and sub layer 122b In others embodiments, the substrate 122 may be multi-layered (not illustrated), for example, the substrate 122 may include sub layer 122a, sub layer 122b, an organic layer (not illustrated) and an inorganic layer (not illustrated). The organic layer (not illustrated) may dispose on the sub layer 122a and sub layer 122b and the inorganic layer (not illustrated) may dispose between sub layer 122a and sub layer 122b.

The material of the substrate 122 may include for example glass, ceramic, quartz, sapphire, acrylic, polyimide (PI), polyethylene terephthalate (PET), polycarbonate (PC), polyethersulfone (PES), polybutylene terephthalate (PBT), polyethylene naphthalate (PEN), polyarylate (PAR), other suitable materials or combinations thereof, but the present disclosure is not limited thereto. The material of the sub layer 122a and sub layer 122b may include for example glass, ceramic, quartz, sapphire, acrylic, polyimide (PI), polyethylene terephthalate (PET), polycarbonate (PC), polyethersulfone (PES), polybutylene terephthalate (PBT), polyethylene naphthalate (PEN), polyarylate (PAR), other suitable materials or combinations thereof, but the present disclosure is not limited thereto. The conductive wiring 124 may have metal material, such as Ti (titanium), aluminum (Al), Molybdenum (Mo) and copper (Cu) or combination thereof, but is not limited to. The insulating layer 126 may comprise inorganic material or organic material. In some embodiments, the inorganic material may include, but is not limited to, silicon nitride, silicon oxide, silicon oxynitride, aluminum oxide. In some embodiments, the organic material may include, but is not limited to, epoxy resins, acrylic resins such as polymethylmethacrylate (PMMA), benzocyclobutene (BCB), polyimide, and polyester, polydimethylsiloxane (PDMS) or polyfluoroalkoxy (PFA). In some embodiments, the conductive wiring 124 may have a plurality of layers, such as three layers: Ti—Al—Ti configuration and Mo—Al—Mo configuration, or two layers: Al—Ti configuration and Al—Mo configuration; in another conductive wiring 124 may have single layer including Ti, Al, Mo or Cu, but is not limited to.

FIG. 3 is a cross-sectional view diagram along line A-A' in FIG. 2, wherein the conductive wiring 124 is part of the wiring structure 120. Regarding FIG. 3, in this embodiment, the conductive wiring 124 may include a plurality of conductive wiring elements disposed on the substrate 122. The conductive wiring 124 has a top side 1242, a bottom side 1244 and two lateral side walls 1246 and 1248. The bottom side 1244 is adjacent to the substrate 122, and the top side 1242 is opposite to the bottom side 1244 and away from the substrate 122. The insulating layer 126 wraps around the conductive wiring 124 through the top side 1242 and two side walls 1246 and 1248, wherein there is a gap G between the insulating layer 126 and the side wall 1246 (or side wall 1248). In detail, the insulating layer 126 warps the aforementioned wiring structure (124) at least by surrounding the top surface or both lateral sides of the conductive wiring 124. The insulating layer 126 may be in contact with the top surface or both lateral sides of the conductive wiring 124, or may be adjacent to the surface/side of the conductive wiring 124 with a gap therebetween.

Figure 4:
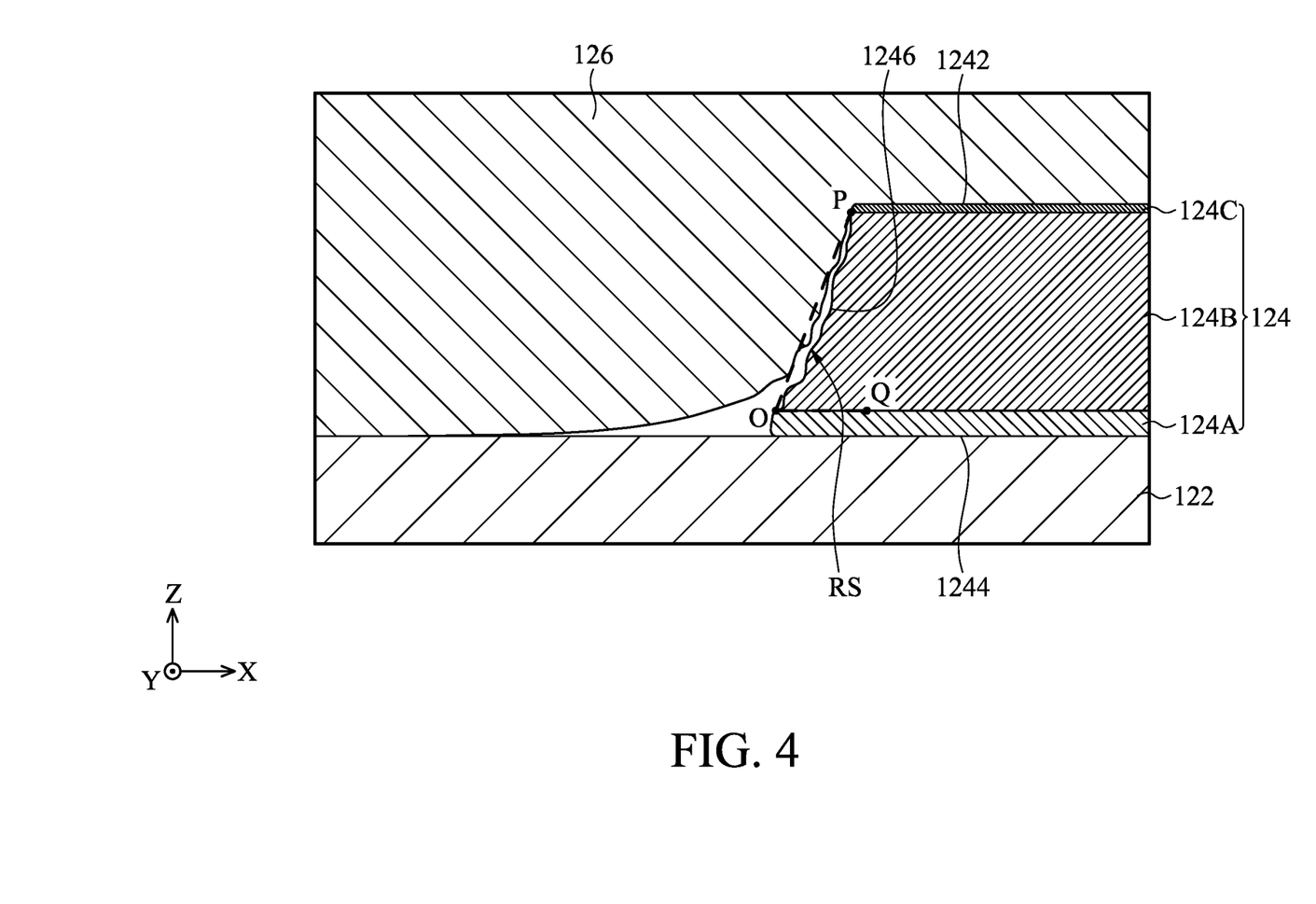
FIG. 4 is a schematic diagram of the partial conducting wiring, the insulating layer and the substrate.

FIG. 4 shows the conductive wiring 124 includes a plurality of layers according to another embodiment. In this embodiment, the conductive wiring 124 has three layers: a first layer 124A, a second layer 124B, and a third layer 124C. The first and third layers 124A, 124C may have Ti or Mo material, and the second layer 124B may have Al material, but not limit to. More detail, the conductive wiring 124 has a stair structure RS with the plurality of layers. The angle ∠POQ can be defined by the angle between the two lines OP (first line) and OQ (second line), wherein the inclined line OP is defined as the line which connects the endpoint of the junction (P) of the third layer 124C and the second layer 124B and the endpoint of the junction (O) of the second layer 124B and the first layer 124A at the side wall 126 (or 128, in another embodiment), and the line OQ is defined as a line which starts from the endpoint O and is substantially parallel to the surface of the substrate 122 (along the X-axis direction).

In this embodiment, the ∠POQ is between 60 degrees to 120 degrees, such as 70 degrees, 80 degrees, 90 degrees, or 100 degrees. In some embodiments, the ∠POQ is 70 to 85 degrees. When the angle of the side wall (such as ∠POQ) of the conductive wiring 124 in the bending region is large, it is easier to make the insulating layer (for example, PLN) form a turbulence during the flow during the process, which helps to form the gap. Therefore, it is easier to form the gap when the side wall has an inclined angle with respect to the vertical side wall.

Figure 5:
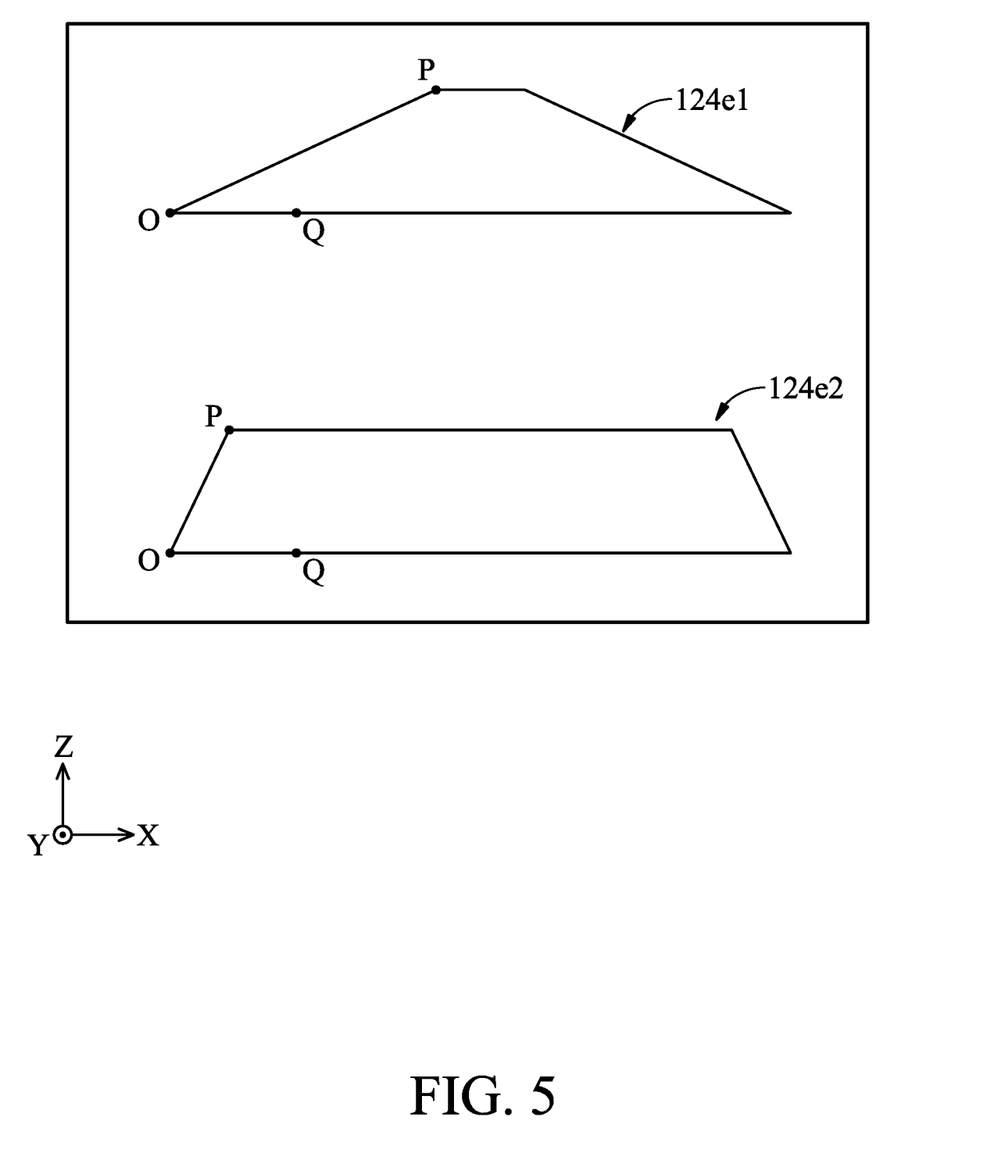
FIG. 5 is a schematic diagram showing two different conductive wirings having different angles ∠POQ and thicknesses.

FIG. 5 shows the angle ∠POQ and the thickness (measured in Z-axis direction) on different conductive wirings 124e1 and 124e2. The ∠POQ in conductive wirings 124e1 has a relatively small angle, while the ∠POQ in conductive wirings 124e2 has a relatively large angle. The greater the angle of the side wall (∠POQ) of the wiring, the greater the average thickness of the wiring. With a larger average thickness, the strength of the wiring is enhanced so that the situation of breaking during a bending process can be effectively reduced or avoided. With ∠POQ between 60 to 120 degrees, such as the embodiment in FIG. 4, the conductive wiring 124, the occurrence of wire breakage will be reduced or avoided.

Figure 6:
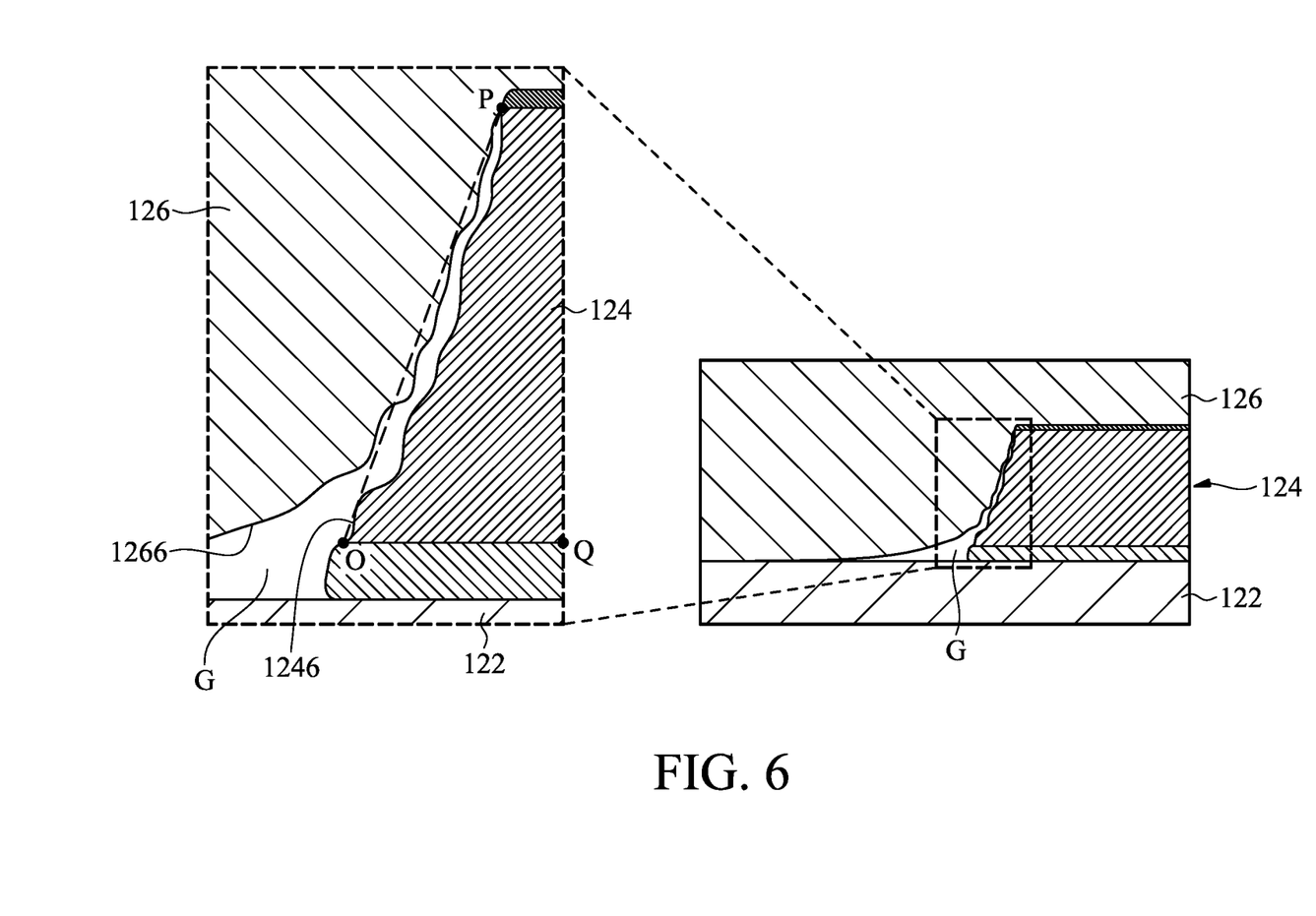
FIG. 6 is a schematic diagram of the partial conducting wiring, the insulating layer and the substrate, with an enlarge diagram of the side wall of the conducting wiring.

FIG. 6 shows a portion of the conductive wiring 124 and the enlarged area A according to another embodiment. In this embodiment, the side wall 1246 (or 1248) is uneven (e.g. an uneven side wall), so that the size of the gap G between the insulating layer 126 and the uneven side wall 1246 is more than with an even or a straight-shape side wall (such as the line OP). In some embodiments, the sidewall 1266 of the insulating layer 126 also is uneven.

Figure 7:
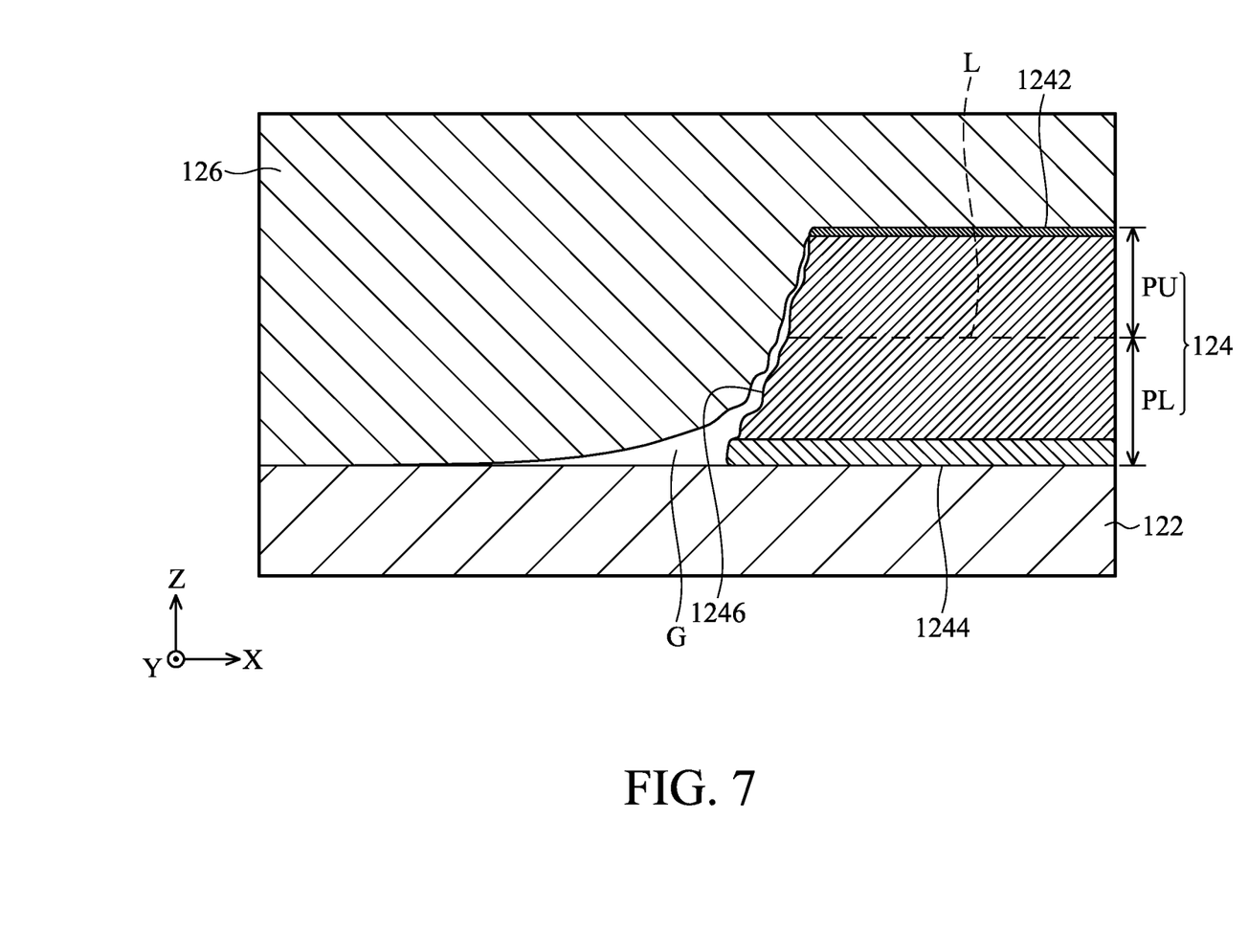
FIG. 7 is a schematic diagram of the conducting wiring is divided to two parts by a dividing line.
Figure 8:
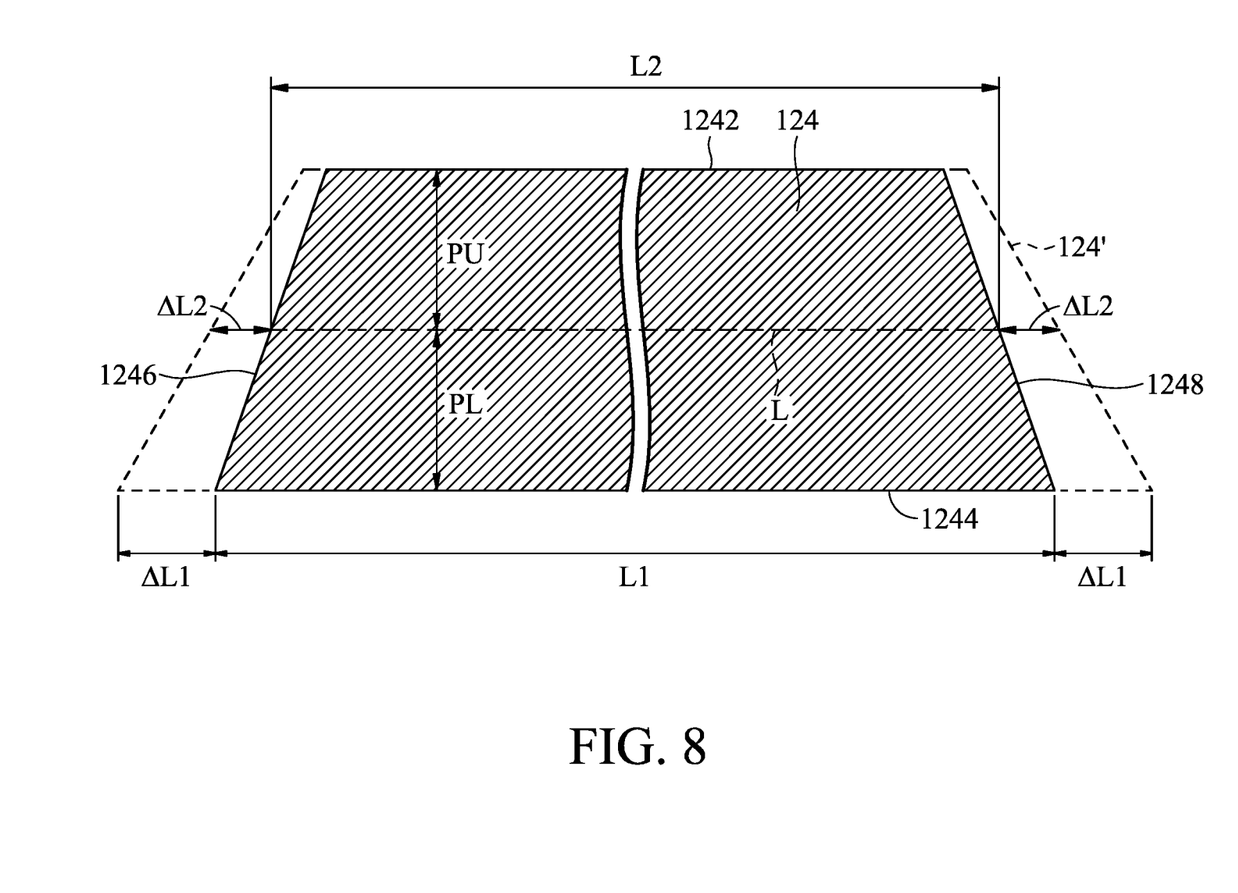
FIG. 8 is a schematic diagram of the conducting wiring and the deformed conducting wiring.

FIG. 7 shows the conductive wiring 124 can be defined two parts by a dividing line L: the lower part PL and the upper part PU. The dividing line L is defined at a position which is half the thickness of (in Z-axis; the thickness in the direction that is perpendicular to the bottom side 1242) the conductive wiring 124 (or the position of 50% of the overall thickness), to divide the conductive wiring 124 into two parts PL and PU. The lower part PL is adjacent to the substrate 122, and the upper part PU is away from the substrate 122 relative to the lower part PL. In this embodiment, the width L1 of the lower part PL is larger than the width L2 of the upper part PU. In some embodiment, the width L1 may be the maximum width of the lower part PL, and the width L2 may be the maximum width of the upper part PU (see FIG. 8). In some embodiment, the gap G is positioned at the lower parts PL of one of side walls (1246 or 1248). In others embodiment, the gap G is positioned at the lower parts PL of both side walls (1246 or 1248). When the conductive wiring 124 suffers from the stress, the conductive wiring 124 deforms, as to the deformed conductive wiring 124', as shown in FIG. 8. Due to the thickness of the conductive wiring 124 is extremely small relative to the overall panel, it can be assumed that the entire conductive wiring 124 is subjected to approximately the same stress (σ).

According to the formula (1):

$$\text{Stress } (\sigma) = \text{Young's modulus } (E) * \text{Strain } (\varepsilon) \quad (1)$$

Therefore, the entire conductive wiring 124 is subject to approximately the same strain (when the Young's modulus is constant). The strain (ε) is a ratio ($^\Delta L/L$) (see the formula (2) below), wherein the L represents to the original width, and the $^\Delta L$ represents to the with deformation value:

$$\varepsilon = ^\Delta L/L \quad (2)$$

Due to the wider part of the wiring, such as the lower part PL of the conductive wiring 124, the deformation value ΔL at the lower part PL will be larger. That is, the deformation value ΔL1 at the lower part PL is larger than the deformation value ΔL2 at the upper part PU. In this embodiment, the gap at the lower part PL is designed to be larger than at the upper part PU, so that the stress can be released at the aforementioned gap.

Figure 9:
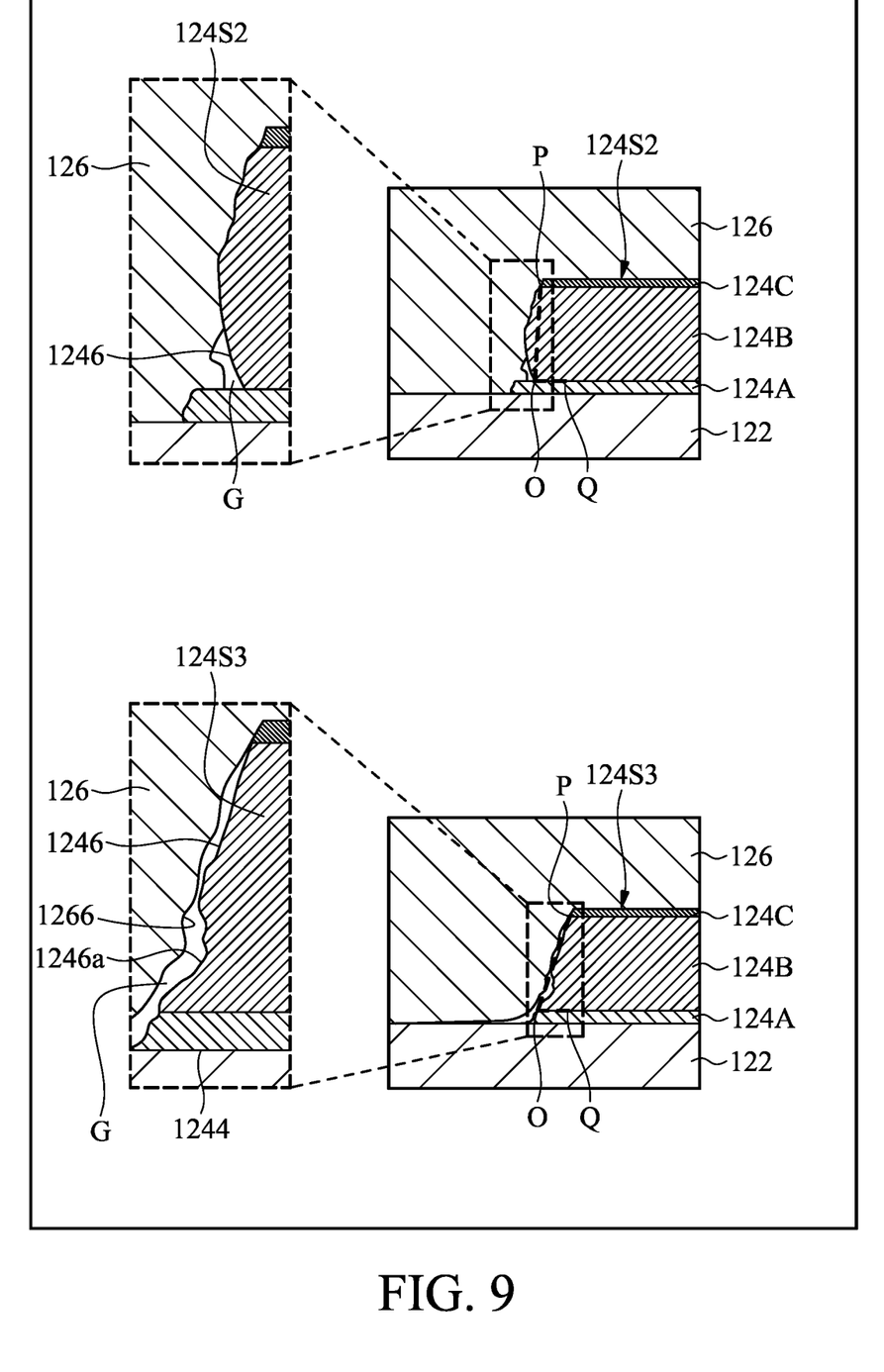
FIG. 9 is a schematic diagram of different types of the conducting wiring according to other embodiments of the present disclosure.

FIG. 9 shows the conductive wirings 124S2 and 124S3 with different types of side walls according to some embodiments in the present disclosure. It should be noted that, the same or corresponding element or structure labels are used in those embodiments as FIG. 4 for clarity.

Regarding the conductive wiring 124S2, the lateral side wall 1246 has a structure with a substantially convex curve, the length of the layer 124A is greater than the length of the layer B, the insulating layer 126 covers one end of the layer 124A, and the insulating layer 126, the layer 124A and 124 layer B form a gap G. The space of gap G is positioned at the lower part of the side wall 1246. In one embodiment, the ∠POQ in the conductive wiring 124S2 is 80 to 88 degrees.

Regarding the conductive wiring 124S3, the side wall 1246 has a notch 1246a near the bottom side 1244 or near the substrate 122, so that the space of the gap between the insulating layer 126 is large at the lower part of the side wall 1246. In one embodiment, the ∠POQ the conductive wiring 124S3 is 75 to 85 degrees.

Figure 10:
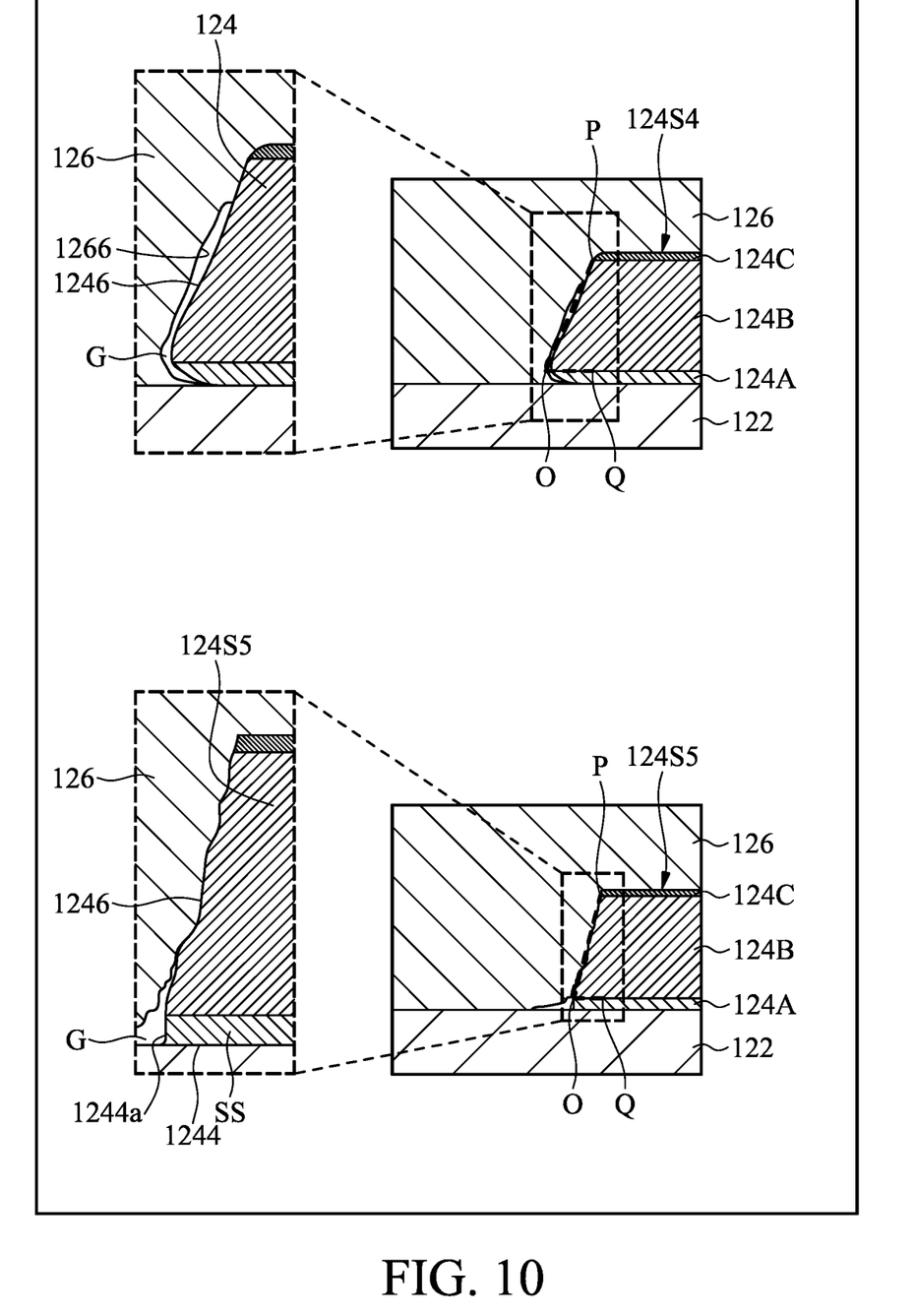
FIG. 10 is a schematic diagram of different types of the conducting wiring according to other embodiments of the present disclosure.

FIG. 10 shows the conductive wirings 124S4 and 124S5 with different types of side walls according to some embodiments in the present disclosure. It should be noted that the same or corresponding element or structure labels are used in those embodiments as FIG. 4 for clarity.

Regarding the conductive wiring 124S4, the side wall 1246 also has a structure with a substantially concave curve. The primary difference between the conductive wiring 124S4 and the conductive wiring 124S2, is that the side wall 1246 in this embodiment is more inclined. The angle ∠POQ in the conductive wiring 124S4 is about 55 to 65 degrees, while the angle ∠POQ in the conductive wiring 124S2 is about 85 to 88 degrees. Furthermore, the side wall 1246 at the first layer 124A is recessed and the sidewall 1266 of the insulating layer 126 is not totally fit to the side wall 1246 at upper part of the conductive wiring 124S4, so that the size of the gap G is larger, to give larger space for receiving the conductive wiring 124S4 which is deformed (such as the deformed conductive wiring 124' in FIG. 8).

Regarding the conductive wiring 124S5, the first layer 124A has a side wall 124Aa which is substantially perpendicular to the bottom side 1244, and the substrate 122 and the abutting first layer 124A constitute a step structure SS, and the gap G is between the insulating layer 126 and the step structure SS. More specifically, the step structure SS is a structure formed by the first layer 124A protruding from the substrate 122, and the side wall 124Aa of the first layer 124A and the top side of the first layer 124A are substantially perpendicular. Therefore, the size of the gap G is larger than the gap G in FIG. 4. In one embodiment, the ∠POQ the conductive wiring 124S5 is 70 to 80 degrees.

Figure 11:
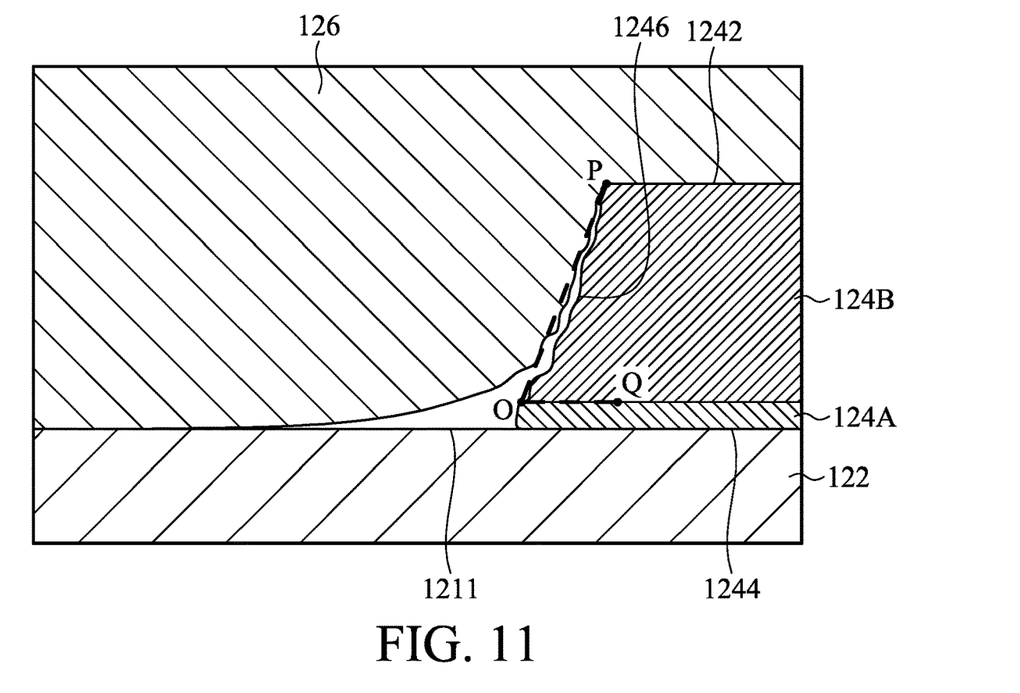
FIG. 11 is a schematic diagram of the partial conducting wiring, the insulating layer and the substrate according to another embodiment of the present disclosure.

FIG. 11 is a schematic diagram of the partial conducting wiring, the insulating layer and the substrate according to another embodiment of the present disclosure. In this embodiment, the conducting wiring 124 has two layers: a first layer 124A and a second layer 124B, wherein the first layer 124A is disposed between the substrate 122 and the second layer 124B. The first layer 124A may have Ti material, and the second layer 124B may have Al material, but it is not limited thereto. The angle ∠POQ can be defined by the angle between the two lines OP (first line) and OQ (second line), wherein the inclined line OP is defined as the line which connects the endpoint of the junction (P) of the second layer 124B and the top side 1244 and the endpoint of the junction (O) of the second layer 124B and the first layer 124A at the side wall 126, and the line OQ is defined as a line which starts from the endpoint O and is substantially parallel to the upper surface 1221 of substrate 122 (along the X-axis). In this embodiment, the ∠POQ is between 60 degrees to 120 degrees. In some embodiments, the ∠POQ is 74 to 78 degrees.

In some embodiments, the wire may have multiple layers (such as the wiring 124 in FIGS. 4, 11, or wirings 124S2 to 124S5 in FIGS. 9, 10), each of layers may have different material. For example, the wiring can include a first layer (e.g. 124A), a second layer (e.g. 124B) and third layer (e.g. 124C). The first layer may have titanium, the second layer may have aluminum, and the third layer may have titanium, but not limited thereto, wherein the thickness of one of the layers accounts for 70-85% of the overall wiring, and the Young's modulus thereof is the smallest. In some embodiments, the maximum thickness of one of the layers is 70-85% of the overall wiring. In some embodiments, the thickness of one of the layer (Z-axis direction in FIG. 7) is 5500-6500 Å, and the Young's modulus of this layer is the smallest. In some embodiments, the maximum thickness of one of the other layers is 5500-6500 Å. With the aforementioned specific proportions and thickness ranges on the specified material layer, the probability of wiring breakage can be reduced or even avoided when performing a bending process since wiring breakage may be caused in tensile stress on the metal trace.

Figure 12:
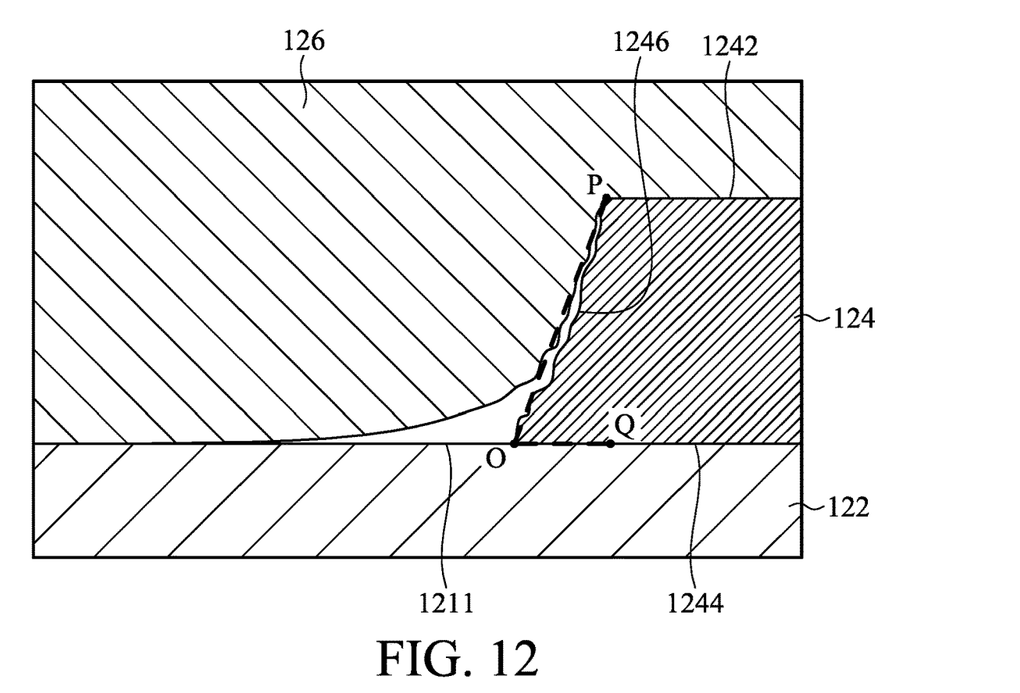
FIG. 12 is a schematic diagram of the partial conducting wiring, the insulating layer and the substrate according to another embodiment of the present disclosure.

FIG. 12 is a schematic diagram of the partial conducting wiring, the insulating layer and the substrate according to another embodiment of the present disclosure. In this embodiment, the conducting wiring 124 has single layer, and the angle ∠POQ can be defined by the angle between the two lines OP (first line) and OQ (second line). Line OP connects the endpoint of the junction (P) of the top side 1242 and the side wall 1246 of the conducting wiring 124 and the endpoint of the junction (O) of the bottom side 1242 and side wall 1246 of the conducting wiring 124, and line OQ is defined as a line which starts from the endpoint O and is substantially parallel to the upper surface 1221 of substrate 122 (along the X-axis direction). In this embodiment, the ∠POQ is between 60 degrees to 120 degrees. In some embodiments, the ∠POQ is 70 to 85 degrees.

It should be noted that the features of the various embodiments can be combined and used as long as they do not violate or conflict the scope of the disclosure.

In summary, the present disclosure provides a wiring structure, including a conductive wiring and an insulating layer. The conductive wiring is disposed on a substrate and has a top side, a bottom side and two side walls opposite to each other. The insulating layer wraps around the conductive wiring at least through the top side and two side walls, wherein there is a gap between the insulating layer and at least one of the two side walls. The present disclosure also provides an electronic device including the aforementioned wiring structure. The embodiment of the present disclosure has at least one of the following advantages or effects. By setting the gap between the insulating layer and the conducting wiring, the gap allows the wiring to release stress in a processing manufacturing. In some manufacturing processes, the wiring will be deformed by the stress when it is bent, and the wiring may be cracked due to the resistance of the insulating layer when the wiring is deformed. By providing the gap, there is a reserved space between the insulating layer and the side wall of the wiring, so that the wiring can release stress in the bent state, thereby less residual stress providing, to improve and increase the quality of the device.

It should be noted that, in some embodiments, the gap G is between the insulating layer 126 and at least one of the side walls 1246 and 1248. In some embodiments, the gap G between the insulating layer 126 and the side wall 1246 or 1248, but there is no gap between the insulating 126 and the other one side wall, also has the effect for stress to release when in a bent processing manufacturing.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the disclosure. It is intended that the standard and examples be considered as exemplary only, with the true scope of the disclosed embodiments being indicated by the following claims and their equivalents.

What is claimed is:

1. A wiring structure, comprising:
a conductive wiring, which is disposed on a substrate and has a top side, a bottom side, and two side walls opposite to each other; and
an insulating layer which wraps around the conductive wiring at least through the top side and two side walls;
wherein there is a gap between the insulating layer and at least one of the two side walls;
wherein the conductive wiring comprises a first layer, a second layer and a third layer, the second layer is disposed between the first layer and the third layer, and the first layer is disposed between the second layer and the substrate;
wherein a thickness of the second layer is greater than a thickness of the first layer, and the thickness of the first layer is greater than a thickness of the third layer.

2. The wiring structure as claimed in claim 1, wherein the substrate is a flexible substrate.

3. The wiring structure as claimed in claim 2, wherein the flexible substrate is in a bending form.

4. The wiring structure as claimed in claim 1, wherein the gap is positioned at a lower part of the at least one of the two side walls.

5. The wiring structure as claimed in claim 1, wherein the bottom side and the at least one of the two side walls, in a cross section of the conductive wiring, have an angle in a range of 60 to 120 degrees.

6. The wiring structure as claimed in claim 1, wherein the gap is positioned at a lower parts of the two side walls.

7. The wiring structure as claimed in claim 1, wherein the conductive wiring has a plurality of layers, and the first layer is adjacent to the substrate.

8. The wiring structure as claimed in claim 7, wherein an angle between a first line and a second line ranges from 60 to 120 degrees, wherein the first line connects a first point and a second point on the at least one of the two side walls, the first point is an endpoint of junction of the third layer and the second layer, and the second point is an endpoint of junction of the second layer and the first layer, and
wherein the second line is defined as a line which starts from the second point and substantially parallel to an upper surface of substrate.

9. The wiring structure as claimed in claim 1, wherein the at least one of the two side walls is uneven.

10. The wiring structure as claimed in claim 1, wherein the conductive wiring has a lower part and an upper part which are defined by a dividing line, wherein the dividing line is defined at a position which is half of a thickness of the conductive wiring in the direction that is perpendicular to the bottom side, wherein the width of the lower part is larger than the width of the upper part.

11. The wiring structure as claimed in claim 1, wherein the at least one of the two side walls has a structure with a convex curve, and the gap is positioned at the lower part of the at least one of the two side walls.

12. The wiring structure as claimed in claim 1, wherein the at least one of the two side walls has a notch near the bottom side.

13. The wiring structure as claimed in claim 1, wherein the at least one of the two side walls has a structure with a convex curve.

14. The wiring structure as claimed in claim 1, wherein the at least one of the two side walls and the substrate constitute a step structure, and the gap is between the insulating layer and the step structure.

15. The wiring structure as claimed in claim 1, wherein an angle between a first line and a second line ranges from 60 to 120 degrees, wherein the first line connects a first point and a second point on the at least one of the two side walls, the first point is the junction of the top side and the one of the two side walls, and the second point is the junction of the bottom side and the one of the two side walls, and wherein the second line is defined as a line which starts from the second point and substantially parallel to an upper surface of substrate.

16. An electronic device, comprising:
a wiring structure, including:
a conductive wiring, which is disposed on a substrate and has a top side, a bottom side and two side walls opposite to each other; and
an insulating layer which wraps around the conductive wiring at least through the top side and two side walls;
wherein there is a gap between the insulating layer and at least one of the two side walls;
wherein the conductive wiring comprises a first layer, a second layer and a third layer, the second layer is disposed between the first layer and the third layer, and the first layer is disposed between the second layer and the substrate;
wherein a thickness of the second layer is greater than a thickness of the first layer, and the thickness of the first layer is greater than a thickness of the third layer.

17. The electronic device as claimed in claim 16, wherein the substrate is a flexible substrate.

18. The electronic device as claimed in claim 16, wherein the flexible substrate is in a bending form.

19. The electronic device as claimed in claim 16, wherein the gap is positioned at a lower part of the at least one of the two side walls.

20. The electronic device as claimed in claim 16, wherein the bottom side and the at least one of the two side walls, in a cross section of the conductive wiring, have an angle in a range of 60 to 120 degrees.

* * * * *